United States Patent [19]

Harris

[11] 4,456,834
[45] Jun. 26, 1984

[54] PROXIMITY SWITCH

[75] Inventor: Geoffrey J. Harris, Swindon, England

[73] Assignee: Square D Company, Palatine, Ill.

[21] Appl. No.: 395,066

[22] PCT Filed: Oct. 16, 1981

[86] PCT No.: PCT/GB81/00226
§ 371 Date: Jun. 25, 1982
§ 102(e) Date: Jun. 25, 1982

[87] PCT Pub. No.: WO82/01630
PCT Pub. Date: May 13, 1982

[30] Foreign Application Priority Data

Oct. 29, 1980 [GB] United Kingdom ............... 8034829

[51] Int. Cl.³ ................ H01H 47/02; H01H 35/00
[52] U.S. Cl. ......................... 307/91; 307/116; 174/35 MS
[58] Field of Search ........... 307/116, 117, 132 EA, 307/140, 91; 335/2, 154, 209; 323/368; 340/365 C; 338/32 H; 361/484; 174/35 MS

[56] References Cited

U.S. PATENT DOCUMENTS

| | | | |
|---|---|---|---|
| 3,447,106 | 5/1969 | Jameal | 335/140 |
| 3,636,370 | 1/1972 | Samberger et al. | 307/116 |
| 3,646,543 | 2/1972 | Morris | 307/116 |
| 3,743,853 | 7/1973 | Dittman et al. | 307/116 |
| 3,950,653 | 4/1976 | Kirkpatrick | 307/116 |
| 3,992,819 | 11/1976 | Schmall | 51/8 R |
| 4,090,091 | 5/1978 | Brown et al. | 307/116 |
| 4,378,504 | 3/1983 | Yamasaki | 307/116 X |

FOREIGN PATENT DOCUMENTS

| | | |
|---|---|---|
| 1469184 | 3/1977 | Fed. Rep. of Germany . |
| 2644112 | 4/1978 | Fed. Rep. of Germany . |
| 2429995 | 1/1980 | France . |
| 2027206A | 2/1980 | United Kingdom . |

Primary Examiner—E. A. Goldberg
Assistant Examiner—Derek Jennings
Attorney, Agent, or Firm—William H. Schmeling; Richard T. Guttman

[57] ABSTRACT

The switch is of the type, known per se, in which an induction coil is driven by an oscillator. The coil is initially positioned in an end cap and secured therein by potting with epoxy resin. This allows the coil and cap to be handled as a unit during manufacture without damage to the coil. The switch is calibrated and adjusted automatically by abrading away part of a resistive layer on a circuit substrate. The circuitry of the switch has its lower potential side coupled to the housing via a capacitor, by means of a conductive adhesive tape trapped between the housing and an end closure.

7 Claims, 6 Drawing Figures

PROXIMITY SWITCH

DESCRIPTION

This invention relates to proximity switches, and in particular to proximity switches including an oscillator and an induction coil and which operate by virtue of a metallic object in proximity to the switch causing the oscillation of the switch circuitry to alter.

Switches of this general type are well known in the art, and operate satisfactorily. However there are problems in manufacturing these switches economically in a manner which gives a good degree of uniformity. The induction coil used is rather sensitive, both electrically and mechanically. To obtain a high sensitivity it is necessary to use a coil wound from fine wire, which is susceptible to damage during assembly of the switch.

It is also conventional to fill the switch with a potting compound such as epoxy resin. The act of filling can move the coil from its mounting, or otherwise damage the coil.

One object of the present invention is thus to provide a manufacturing method which eliminates or mitigates damage to the coil during manufacture. To this end one aspect of the invention provides, in a method of manufacturing a proximity switch having an induction coil and an oscillator circuit, the steps of:
providing an end cap for receipt of the coil;
positioning the coil in the end cap;
potting the coil in the end cap by at least partly filling the latter with a curable potting compound, thereby forming an easily handled unit; and
subsequently connecting the coil to the oscillator circuit and mounting the end cap unit on a housing which encloses the oscillator circuit.

A further problem resides in the fact that variations in the coils and other circuit components are inevitable; to give switches with a uniform sensitivity it is therefore necessary to adjust the detector circuit during manufacture. This has previously been done by providing a trimming potentiometer in the circuit, and adjusting this by hand. Such adjustment is time consuming and labour intensive, and the accuracy achieved is likely to vary. The use of a trimming potentiometer is also disadvantageous when one wishes to reduce the size of the circuitry by using miniature or micro-miniature components.

Accordingly, the invention also provides, in a method of making a proximity switch including an induction coil, an oscillator driving the coil and a detector circuit, the detector circuit having a resistor which is adjusted during manufacture to compensate for tolerances in the coil and other circuit components, the improvements comprising:
forming said resistor as a resistive layer on a substrate; and
abrading said layer to adjust said resistor until a desired sensitivity is obtained.

A further problem encountered with known proximity switches is that electrical noise on the supply cable can be induced on the metallic housing of the switch and propagate along it to interfere with the induction coil or other parts of the circuit. To prevent or mitigate this, a further aspect of the invention provides a proximity switch including a metallic housing; an end cap at one end of the housing; an induction coil positioned within the end cap; circuitry, including at least an oscillator circuit connected to the coil, positioned within the housing; and a metallic closure for the other end of the housing, said closure including a cable entry; the switch further including means coupling the lower potential side of the circuit to the housing via a capacitor to suppress propagation of noise on the housing, said means being connected to the housing adjacent the closure.

An embodiment of the invention will now be described, by way of example, with reference to the accompanying drawings, in which.

Figure 4:
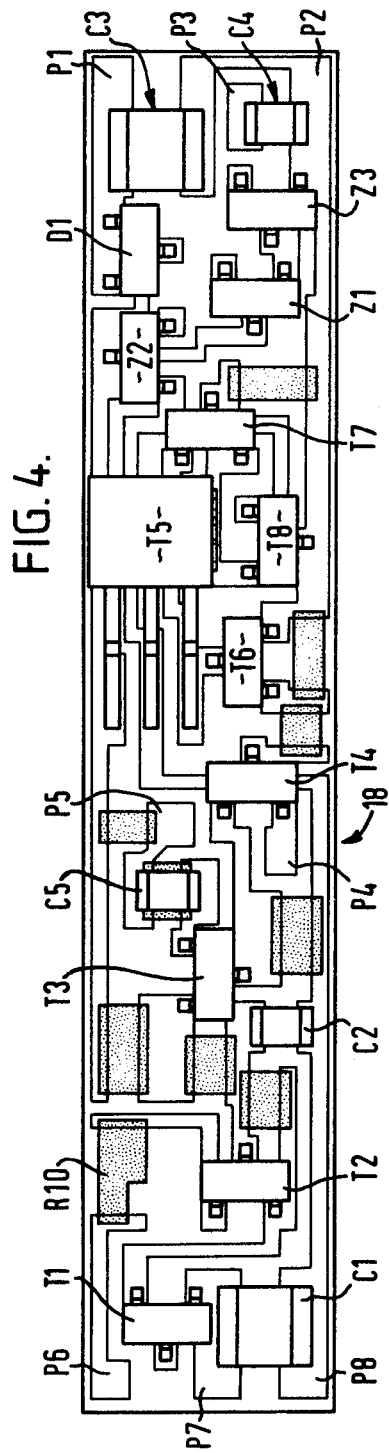
FIG. 4 is an enlarged plan view of a thick film substrate carrying the circuitry of the switch.
Figure 5:
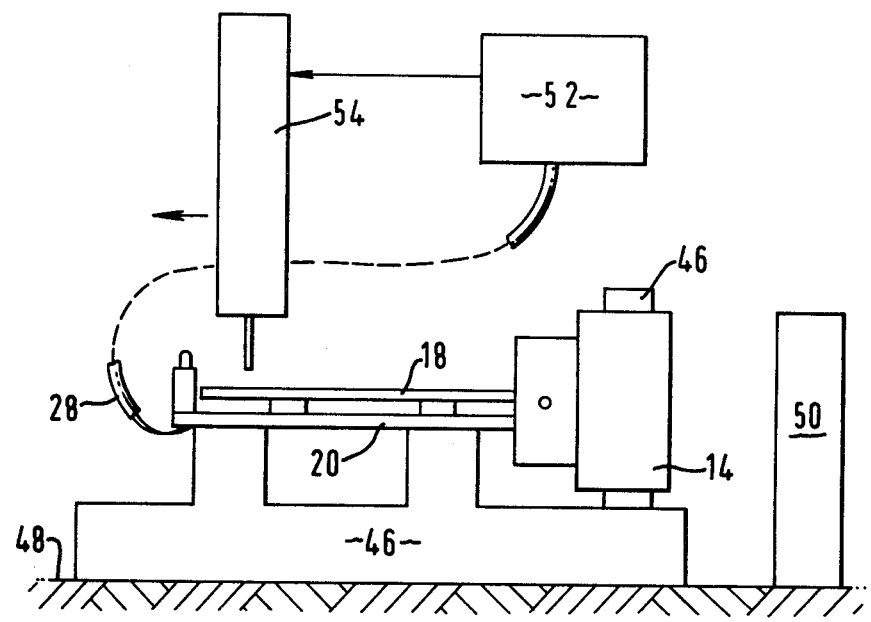
Figure 6:
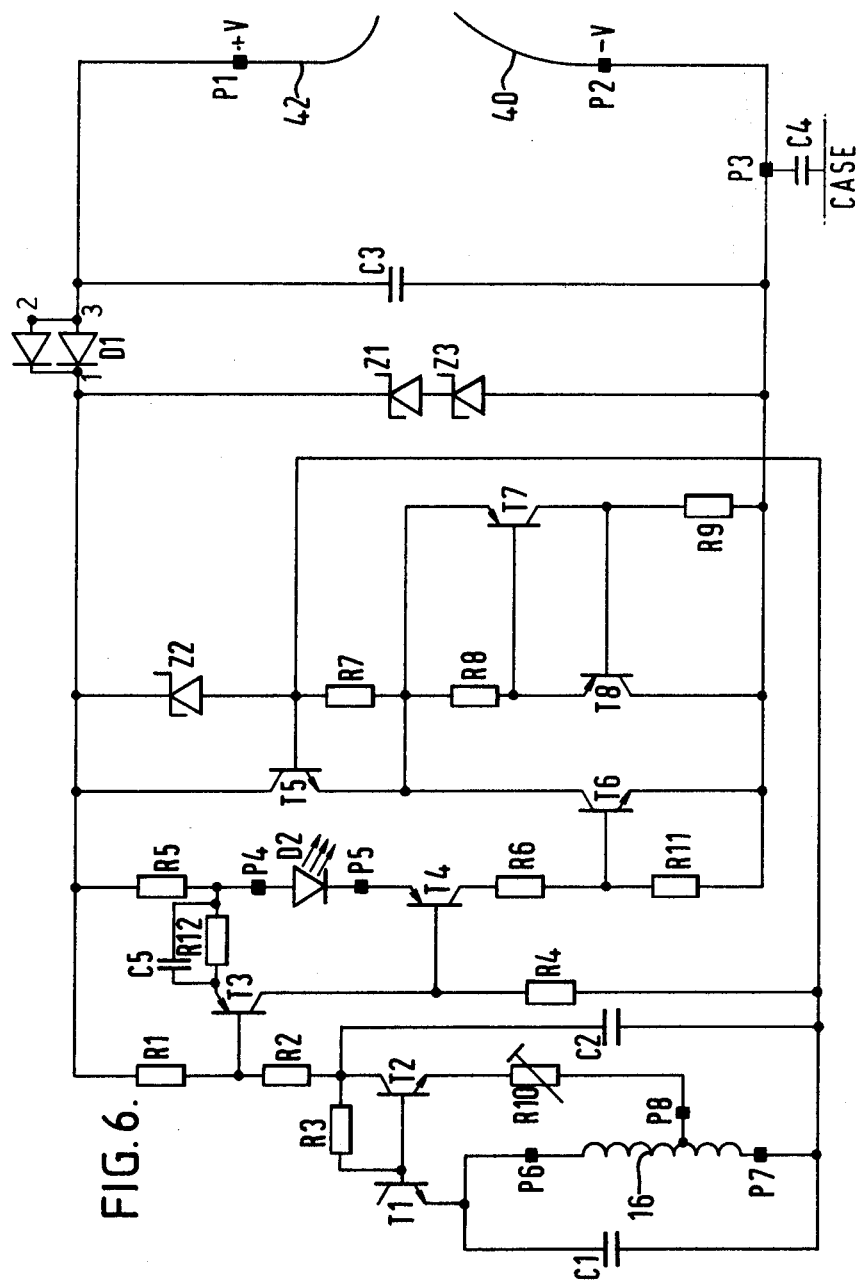

FIG. 5 diagrammatically illustrates one step in the manufacture of the switch; and FIG. 6 is a circuit diagram of the circuitry of FIG. 4.

Figure 1:
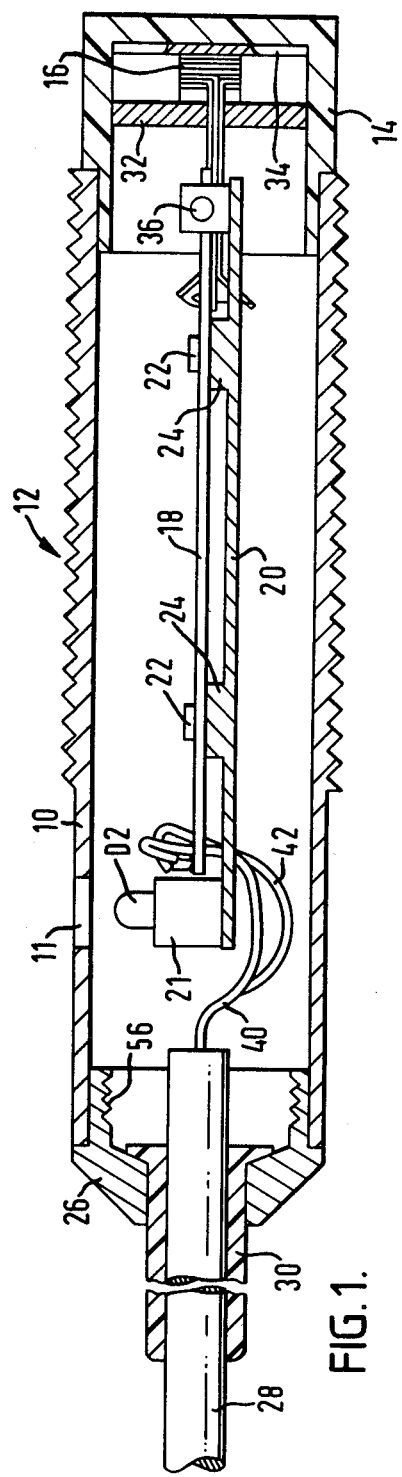
FIG. 1 is a cross-sectional side elevation of a proximity switch in accordance with the invention.

Referring particularly to FIG. 1, the switch has a metal cylindrical housing 10 which is externally threaded at 12 for mounting to a support, e.g. by nuts (not shown). A moulded plastics end cap 14 closes one end of the housing 10 and mounts an induction coil 16. The circuitry of the switch, to be described below, comprises micro-miniature components not shown in FIGS. 1 and 2 on a thick-film printed substrate 18. The substrate 18 is positioned on a plastics carrier 20 by integral moulded studs 22, and secured by adhesive to integral moulded pillars 24. The other end of the housing 10 is closed by a metal cap 26 which has a central aperture for the entry of a two-wire supply cable 28 with cable sleeve 30.

Figure 2:
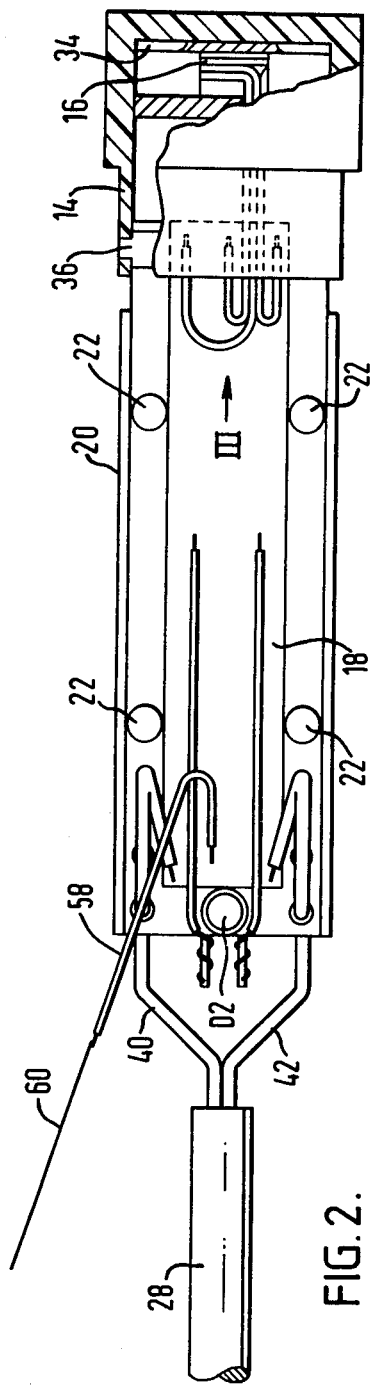
FIG. 2 is a plan view, partly in section, of part of the switch of FIG. 1.
Figure 3:
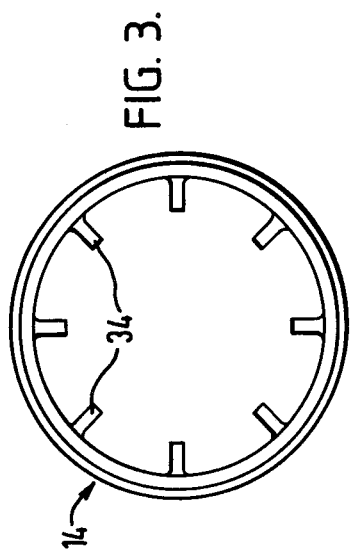
FIG. 3 is an end view in the direction III of FIG. 2 of the end cap of the switch.

The assembly of the switch will now be described with particular reference to FIGS. 1 and 2. The coil 16 is first positioned in the end cap 14 and is secured in position and potted by epoxy resin 32. Suitably a low viscosity two-part resin is used, such as 3M No. 280, and is cured at 100° C. This gives a very low initial viscosity, which assists in obtaining penetration by the resin around the coil and in allowing air bubbles to escape. To the same end, ribs or protrusions 34 (best seen in FIG. 3) are provided on the inner surface of the end cap 14 to hold the coil 16 away from the surface and allow the resin to penetrate.

This procedure has the advantage that, after curing, the coil and end cap form a monolithic unit which can be handled during the remaining assembly operations easily and conveniently, and without risk of damaging or displacing the coil.

Meanwhile, the substrate 18 has the circuit components connected thereon by conventional techniques, for example reflow soldering, and is then secured to the carrier 20 as described above. The carrier 20 is provided with integrally moulded pins 36 which are snapped into cooperating holes in the end cap 14. This provides a mechanical lock between the carrier and the end cap, through a pin and socket type hinged connection which is of convenience when manipulating the assembly and fitting it into jigs and the like. The ends of the coil are now soldered to pads P6, P7 and P8 (FIG. 4) on the substrate 18. The wires 40,42 of the cable 28 are likewise soldered to pads P1 and P2 (FIG. 4).

It is next necessary to adjust the circuitry to match the particular coil and other component tolerances in order to obtain the required sensitivity. This is achieved by trimming a resistor R10 (FIG. 6) while the assembly is energised in the vicinity of a standard target. In accordance with an important feature of the invention, the resistor R10 is provided in the form of a resistive layer on the substrate as seen in FIG. 4, and is trimmed by the apparatus illustrated in FIG. 5.

Referring to FIG. 5, the assembly of substrate 18, carrier 20 and end cap 14 is clamped in a jig shown schematically at 46 and positioned on a work surface 48 at a given distance from target 50. The cable 28 is connected to a control unit 52. An airbrasive unit 54 is started and abrades the layer R10, the airbrasive unit 54 moving in the direction indicated under the control of the control unit 52, for example by being mounted on a motorised trolley (not shown). When the abrasion has increased the resistance of the layer R10 to the correct value, the proximity switch circuit operates and the resulting signal operates the control unit 52 to de-energise the airbrasive unit 54. Thus the trimming of the resistor is automatic and self-correcting.

The airbrasive unit 54 suitably provides aluminium oxide particles in an air stream from a nozzle 0.005" (0.127 mm) by 0.002" (0.051 mm).

After trimming the resistor layer R10, the substrate 18 and the components thereon are coated with a resilient layer (omitted in the drawings). The layer is preferably of soft silicon rubber, e.g. Dow Corning 3140, extruded over the substrate in a layer approximately 3 mm thick. This layer acts to obviate harmful effects on the microminiature components of stresses arising from subsequent potting with and curing of further epoxy resin.

The parts thus far assembled are now united with the housing 10. A suitable adhesive such as "Loctite" 638" is applied to the periphery of the end cap 14, and the assembly is introduced into the housing 10 until the cap 14 is a push fit in the end of the housing. The switch is then filled with a two-component transparent epoxy resin and the metal cap 26 put in place, the further resin then being cured at 65° C. The cap 26 has a coarse internal screw thread 56 to provide a mechanical bond with the resin. The further resin is not shown in FIGS. 1 and 2 for clarity of the other component parts.

Various forms of circuitry suitable for use in the switch are known in the art. The circuitry of FIG. 6 is shown as one example only and, since it is not essential to the present invention, will not be described in detail. In essence it is a two-wire d.c. circuit with all of the components shown in FIG. 6 being mounted on the substrate 18 except the coil 16 and a light-emitting diode (l.e.d.) D2. Transistors T1 and T2 and associated biasing components form an oscillator driving the coil 16. Transistors T3 and T4 provide a snap-action level detector which, when a metal object loads the coil 16, drives into conduction output transistor T6. A regulated power supply for the oscillator and level detector is provided by Zener diode Z2 and associated components T5, R7, R8, T7, T8 and R9. To ensure that a constant voltage appears across Z2, it is essential to maintain a constant current through Z2 under various conditions of supply voltage and external load current. The current into Z2 is regulated by the current regulator T7 and T8. Any additional current is bypassed away from Z2 by T5.

Thus when a metal object is in proximity to the switch, T6 conducts to permit current flow across the wires 40 and 42 to drive a device controlled by the switch either directly or via a relay or the like. The l.e.d. D2 is illuminated when the switch is "on". As seen in FIGS. 1 and 2, the l.e.d. D2 is mounted on a post 21 integral with the carrier 20 to be visible externally of the switch via an aperture 11 in the housing 10.

The items P1–P8 in FIG. 6 are connection pads on the substrate 18.

In accordance with another important feature of the invention, the lower potential side of the circuitry is connected to the housing 10 via a capacitor C4 (FIGS. 4 and 6. It has been found that electrical noise on the cable 28 can be induced onto the metal casing at the point of entry, and propagate along the housing causing spurious effects in the coil 16 or other circuit components. To eliminate or mitigate this, the capacitor C4 is connected to the housing 10 adjacent the cable entry. The connection is effected, referring to FIG. 2, by providing a wire 58 having one end soldered to the substrate 18; to the other end is attached a tape 60. The tape 60 is a known electrically conductive tape of copper foil having one side coated with an electrically-conductive pressure-sensitive adhesive. During assembly of the switch, the tape 60 is arranged to protrude through the rear end of the housing 10; it can be held in this position by pressing the adhesive surface against the housing. When the metal cap 26 is inserted, the tape 60 is trapped and tightly gripped between the cap 26 and the housing 10, thus establishing an electrical connection between both of these and the capacitor C4. Subsequently the protruding end of the tape 60 is simply torn off to leave the external surface of the switch flush.

The fact that this connection is at the rear of the switch adjacent the cable entry is significant, since it prevents noise signals being established on the housing via the cable. External noise induced directly onto the metal housing is similarly eliminated or mitigated by effectively putting the housing and circuit at the same potential with respect to noise frequencies.

There has thus been described a proximity switch which significantly improves ease and repeatability of manufacture.

I claim:
1. A proximity switch comprising:
a metal cylindrical housing having a pair of ends,
a non-metallic end cap positioned in one of the ends,
a metallic closure positioned at the other end of the housing,
an induction coil positioned within a cavity in the cap and secured therein by a potting compound, circuitry including micro-miniature components connected in circuit with the coil and mounted on a substrate,
a plate-like carrier positioned in the housing and providing a mounting for the substrate,
a pin and socket pivotal hinged connection between the cap and the carrier for maintaining a connection between the carrier and the cap when the carrier and cap are positioned in the housing, and
means including a capacitor coupling a low potential side of the circuitry to the housing and an electrically conductive adhesive tape secured to the substrate and trapped between the housing and the closure to suppress the propagation of electric noise on the housing.

2. The proximity switch as recited in claim 1 including additional potting compound filling the housing.

3. The proximity switch as recited in claim 1 wherein the end cap has holes therein and the hinged pivotal connection is provided by pins extending from the carrier into the holes.

4. A proximity switch comprising:
a cylindrical housing,
an end cap received in one end of the housing,
an induction coil positioned in a cavity within the end cap and secured therein by a potting compound,
circuitry including micro-miniature components connected in circuit with the coil and mounted on a substrate,
a plate-like carrier positioned in the housing and providing a mounting for the substrate,
and a pin and socket hinged pivotal connection between the carrier and the end cap for maintaining a connection between the end cap and the carrier when the carrier and the cap are positioned in the housing.

5. The proximity switch as recited in claim 4 including additional potting compound filling the housing.

6. The proximity switch as recited in claim 4 wherein the end cap has holes therein and the hinged pivotal connection is provided by pins extending from the carrier into the holes.

7. A proximity switch comprising:
a metal housing having a pair of ends, an end cap at one of the ends of the housing, an induction coil positioned within the cap,
circuitry including micro-miniature components connected in circuit with the coil and mounted on a substrate within the housing,
a metallic closure for the other end of the housing, said closure having a cable entry, and
means including a capacitor coupling a low potential side of the circuitry to the housing and an electrically conductive adhesive tape secured to the substrate and trapped between the housing and the closure to suppress the propagation of electrical noise on the housing.

* * * * *